United States Patent
Lee (10) Patent No.: US 8,033,139 B2
(45) Date of Patent: Oct. 11, 2011

(54) BANK PRECHARGE SIGNAL GENERATION CIRCUIT

(75) Inventor: Joo Hyeon Lee, Bucheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 291 days.

(21) Appl. No.: 12/459,111

(22) Filed: Jun. 26, 2009

(65) Prior Publication Data

US 2010/0202226 A1 Aug. 12, 2010

(30) Foreign Application Priority Data

Feb. 12, 2009 (KR) .................. 10-2009-0011596

(51) Int. Cl.
*G11C 7/00* (2006.01)

(52) U.S. Cl. .............. 65/203; 365/194; 365/230.03

(58) Field of Classification Search .......... 365/203, 365/194, 230.03
See application file for complete search history.

(56) References Cited

U.S. PATENT DOCUMENTS

| 5,636,173 | A | 6/1997 | Schaefer | |
|---|---|---|---|---|
| 2004/0264275 | A1* | 12/2004 | Gou | 365/203 |
| 2005/0132131 | A1 | 6/2005 | David | |
| 2007/0268763 | A1* | 11/2007 | Im et al. | 365/203 |
| 2008/0074937 | A1* | 3/2008 | Yang | 365/194 |

FOREIGN PATENT DOCUMENTS

| JP | 11-45570 | 2/1999 |
|---|---|---|
| KR | 10-2005-0003527 | 1/2005 |

* cited by examiner

*Primary Examiner* — Tuan Nguyen
*Assistant Examiner* — Toan Le
(74) *Attorney, Agent, or Firm* — John P. White; Cooper & Dunham LLP (57) ABSTRACT

A bank precharge signal generation circuit includes a precharge signal generation unit for generating a second precharge signal including a pulse, which is generated in a period delayed by a predetermined period as compared to a pulse of a first precharge signal, in response to an all-bank precharge signal, and a bank precharge signal generation unit for receiving the first and second precharge signals and generate first and second bank precharge signals for precharging first and second banks.

20 Claims, 7 Drawing Sheets

BANK PRECHARGE SIGNAL GENERATION CIRCUIT

TECHNICAL FIELD

The present invention relates to a semiconductor memory device, and more particularly, to a bank precharge signal generation circuit capable of enhancing noise immunity and reception sensitivity by reducing a peak current.

BACKGROUND

A synchronous dynamic random access memory (SDRAM) is a semiconductor memory device which operates synchronously with an external clock and requires stabilization the semiconductor memory device by sequentially inputting external command after initial application of a driving operation voltage (VDD). Particularly, in the SDRAM, a precharge operation is very important since all operations are performed in the precharge state.

Figure 1:
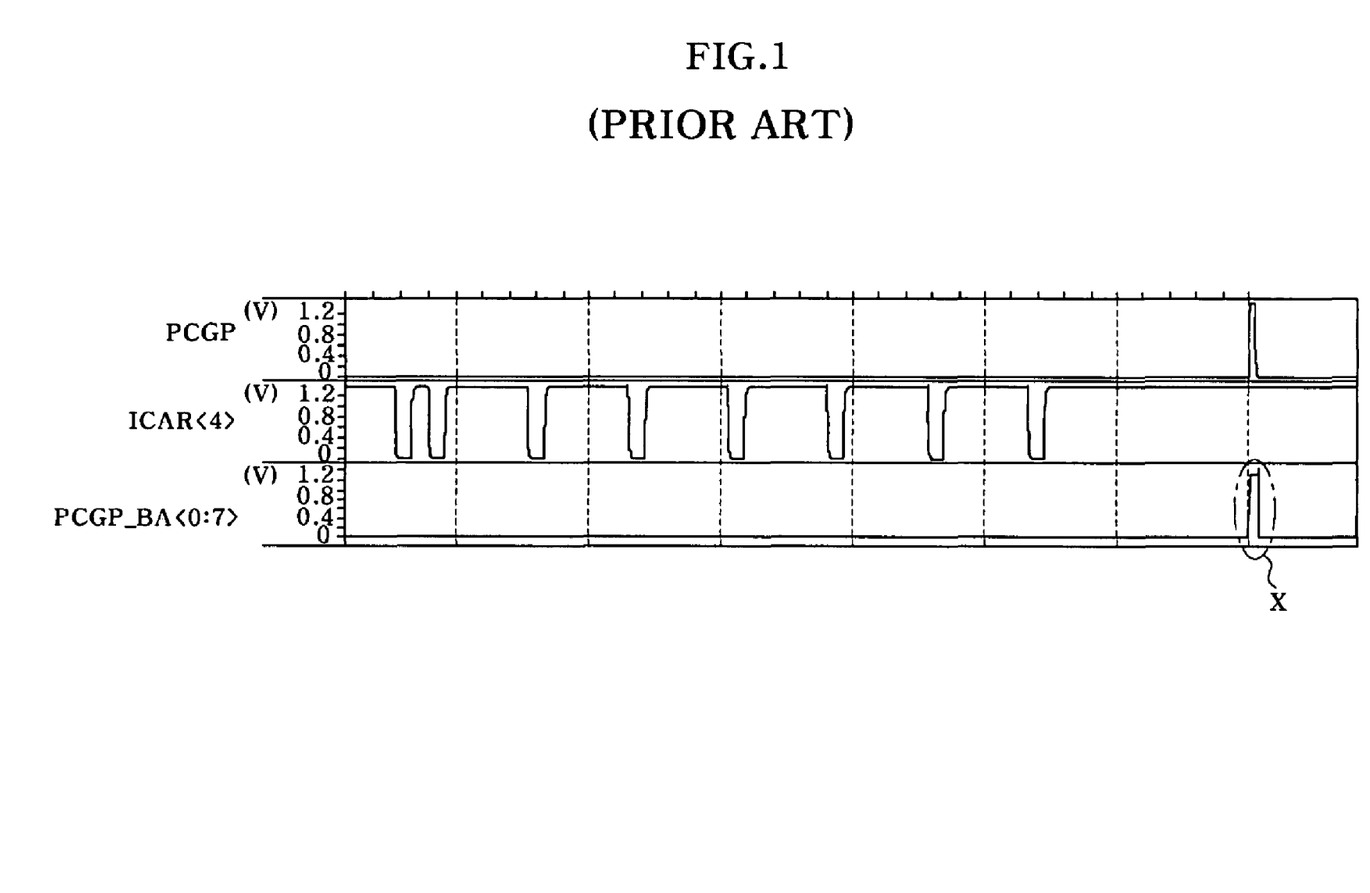
FIG. 1 is a timing diagram illustrating operation of a conventional bank precharge signal generation circuit.

The precharge operation in a semiconductor memory device having a multi-bank structure is classified into an all-bank precharge operation in which the precharge is performed on all of the banks, and a single-bank precharge operation, in which the precharge is performed by the banks. In the all-bank precharge operation, a peak current is increased since the precharge of the banks is performed at the same time, which will be described with reference to FIG. 1 illustrating a timing diagram of operation of a conventional bank precharge signal generation circuit.

As illustrated, if an all-bank precharge signal ICAR<4> is at a high level when a pulse of a precharge signal PCGP is inputted, an all-bank precharge operation is initiated. That is to say, when the all-bank precharge signal (ICAR<4> of a high level and a precharge pulse of a high level are inputted, first through eighth bank precharge signals PCGP_BA<0:7> for precharging first through eighth banks, respectively, in a semiconductor memory device with a eight-bank structure are enabled to a high level at the same time (point X).

As such, simultaneous initiation of the precharge operation on the first through eighth banks sharply increases the peak current consumed at a time point of initiation of the all-bank precharge operation and the sharp increase in the peak current causes deterioration of noise immunity and mobile reception sensitivity.

BRIEF SUMMARY

In an embodiment of this disclosure, there is provided a bank precharge signal generation circuit that sequentially precharges a plurality of banks with predetermined delay periods in an all-bank precharge operation to reduce a peak current, and thereby noise immunity and mobile reception sensitivity can be enhanced.

In an embodiment, a bank precharge signal generation circuit includes a precharge signal generation unit for generating a second precharge signal including a pulse, which is generated in a period delayed by a predetermined period as compared to a pulse of a first precharge signal, in response to an all-bank precharge signal, and a bank precharge signal generation unit for receiving the first and second precharge signals and generate first and second bank precharge signals for precharging first and second banks.

In another embodiment, a bank precharge signal generation circuit includes a first bank precharge signal generation unit for generating a first bank precharge signal enabled when a pulse of a first precharge signal is inputted in a state that an all-bank precharge signal is enabled, and a second bank precharge signal generation unit for generating a second bank precharge signal enabled when a pulse of a second precharge signal is inputted in a state that an all-bank precharge signal is enabled, wherein the pulse of the second precharge signal is inputted, with the pulse of the second precharge signal being delayed by a predetermined period as compared to the pulse of the first precharge signal.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF THE PREFERRED EMBODIMENTS

Hereinafter, an embodiment of the present invention will be described with reference to accompanying drawings. The embodiment is for illustrative purposes only, and the scope of the present invention is not limited thereto.

Figure 2:
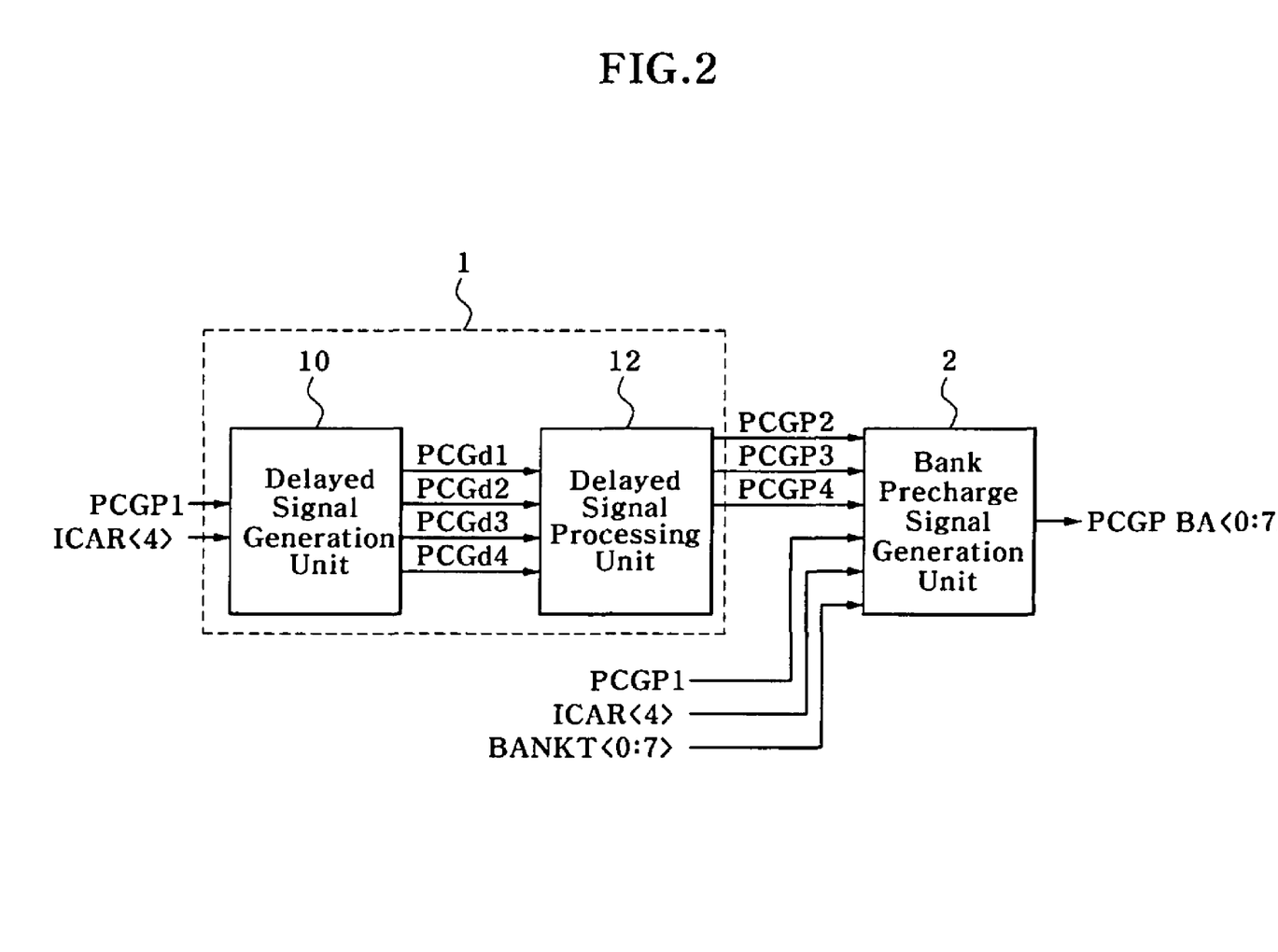
FIG. 2 is a block diagram illustrating a configuration of a bank precharge signal generation circuit in accordance with an embodiment of the present invention.

FIG. 2 is a block diagram illustrating a configuration of a bank precharge signal generation circuit in accordance with an embodiment of the present invention.

The bank precharge signal generation circuit illustrated in FIG. 2 includes a precharge signal generation unit 1 and a bank precharge signal generation unit 2. The precharge signal generation unit 1 includes a delayed signal generation unit 10 and a delayed signal processing unit 12.

Figure 3:
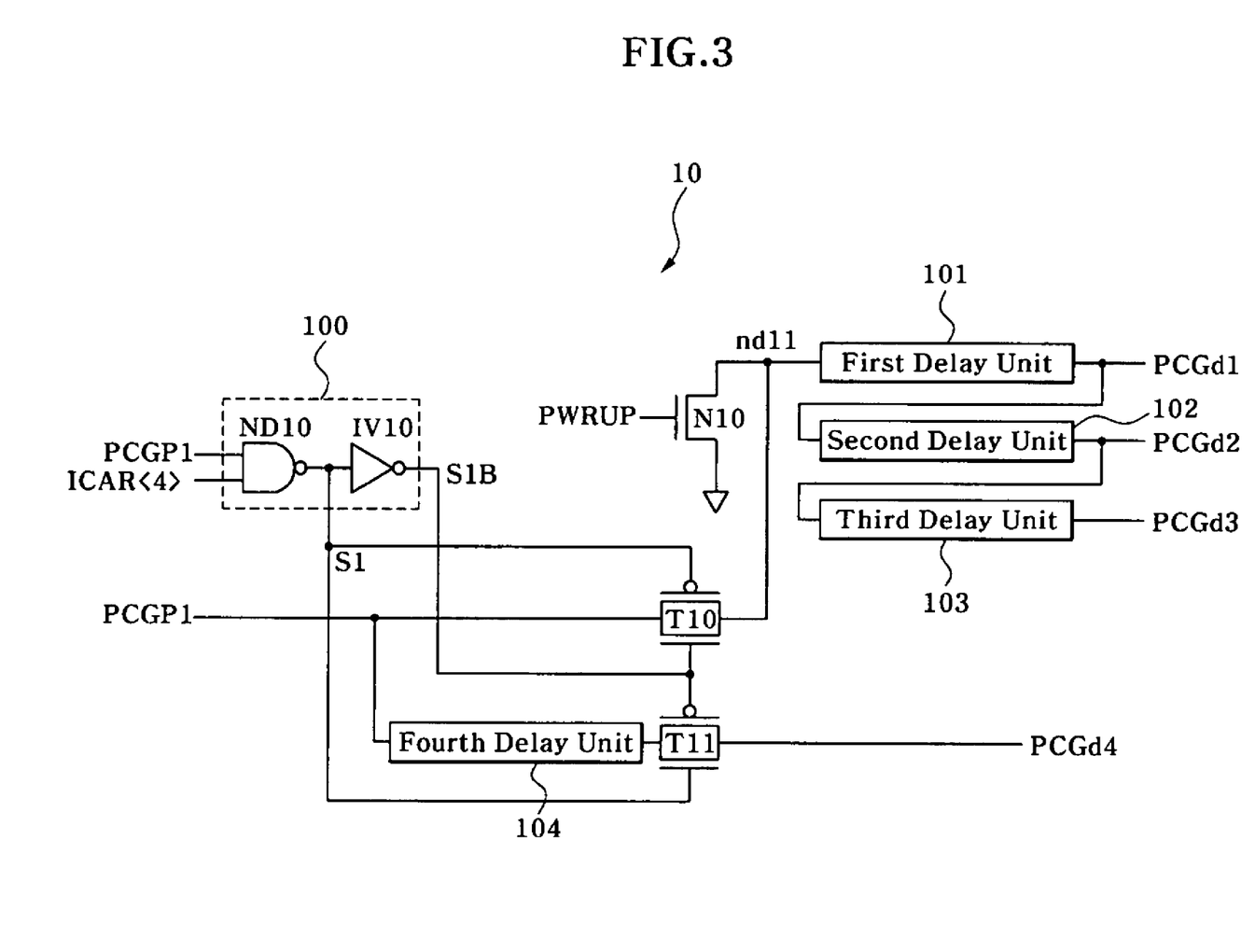
FIG. 3 is a circuit diagram illustrating a delayed precharge signal generation unit included in the bank precharge signal generation circuit shown in FIG. 2.

The delayed signal generation unit 10 includes, as shown in FIG. 3, a logic unit 100 which receives a first precharge signal PCGP1 and an all-bank precharge signal ICAR<4> and generates a control signal S1 and an inverted control signal S1B, a transfer gate T10 which transfers the first precharge signal PCGP1 in response to the control signal S1 and the inverted control signal S1B, a first delay unit 101 which delays an output signal of the transfer gate T10 by a predetermined period to generate a first delayed precharge signal PCGd1, a second delay unit 102 which delays an output signal of the first delay unit 101 by a predetermined period to generate a second delayed precharge signal PCGd2, a third delay unit 103 which delays an output signal of the second delay unit 102 by a predetermined period to generate a third delayed precharge signal PCGd3, a fourth delay unit 104 which delays the first precharge signal PCGP1 by a predetermined period, a transfer gate T11 which transfers an output signal of the fourth delay unit 104 in response to the control signal S1 and the inverted control signal S1B, and an NMOS transistor N10 which initializes a node nd11 to a low level in response to a power up signal PWRUP in a power up period. Here, the first precharge signal PCGP1 is a signal which is inputted as a pulse for the bank precharge operation, and the all-bank precharge signal ICAR<4> is a signal which is at a low level in a single-bank precharge operation and is at a high level in the all-bank precharge operation.

The delayed signal generation unit 10 having the aforementioned configuration generates the first through third delayed precharge signal PCGd1-PCGd3 which are all at a low level in response to the all-bank precharge signal ICAR<4> at a low level in the single-bank precharge operation, and delays the first precharge signal PCGP1 by the period of the fourth delay unit 104 to generate the fourth delayed precharge signal PCGd4. Also, the delayed signal generation unit 10 generates the fourth delayed precharge signal PCGd4 of a low level in response to the first precharge signal PCGP1 and the all-bank precharge signal ICAR<4>, both of which are at a high level in the all-bank precharge operation, delays the first precharge signal PCGP1 by the delay period of the first delay unit 101 to generate the first delayed precharge signal PCGd1, delays the output signal of the first delay unit 101 by the delay period of the second delay unit 102 to generate the second delayed precharge signal PCGd2, delays the output signal of the second delay unit 102 by the delay period of the third delay unit 103 to generate a third delayed precharge signal PCGd3.

Figure 4:
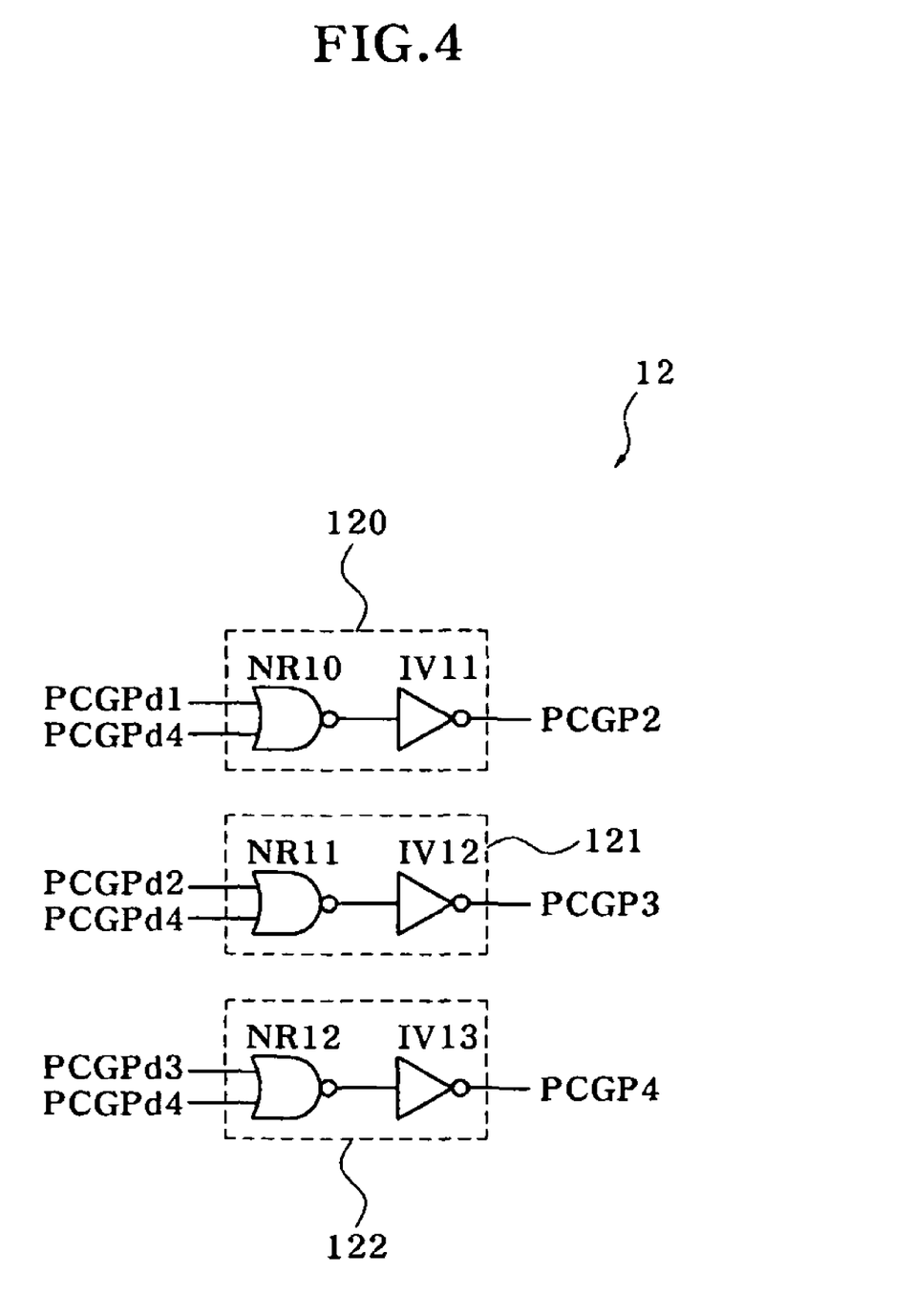
FIG. 4 is a circuit diagram illustrating a precharge pulse generation unit included in the bank precharge signal generation circuit shown in FIG. 2.

The delayed signal processing unit 12 includes, as shown in FIG. 4, a logic unit 120 which performs a logic OR operation on the first delayed precharge signal PCGd1 and the fourth delayed precharge signal PCGd4 inputted thereto, to generate a second precharge signal PCGP2, a logic unit 121 which performs a logic OR operation on the second delayed precharge signal PCGd2 and the fourth delayed precharge signal PCGd4 inputted thereto, to generate a third precharge signal PCGP3, and a logic unit 122 which performs a logic OR operation on the third delayed precharge signal PCGd3 and the fourth delayed precharge signal PCGd4 inputted thereto, to generate a fourth precharge signal PCGP4.

The delayed signal processing unit 12 having the aforementioned configuration buffers the fourth delayed precharge signal PCGd4 in response to the first through third delayed precharge signals PCGd1-PCGd3, which are all at a low level in the single-bank precharge operation, to generate the second through fourth precharge signals PCGP2-PCGP4. Meanwhile, in response to the fourth delayed precharge signal PCGd4 at a low level in the all-bank precharge operation, the delayed signal processing unit 12 buffers the first delayed precharge signal PCGd1 to generate the second precharge signal PCGP2, buffers the second delayed precharge signal PCGd2 to generate the third precharge signal PCGP3 and buffers the third delayed precharge signal PCGd3 to generate the fourth precharge signal PCGP4.

Figure 5:
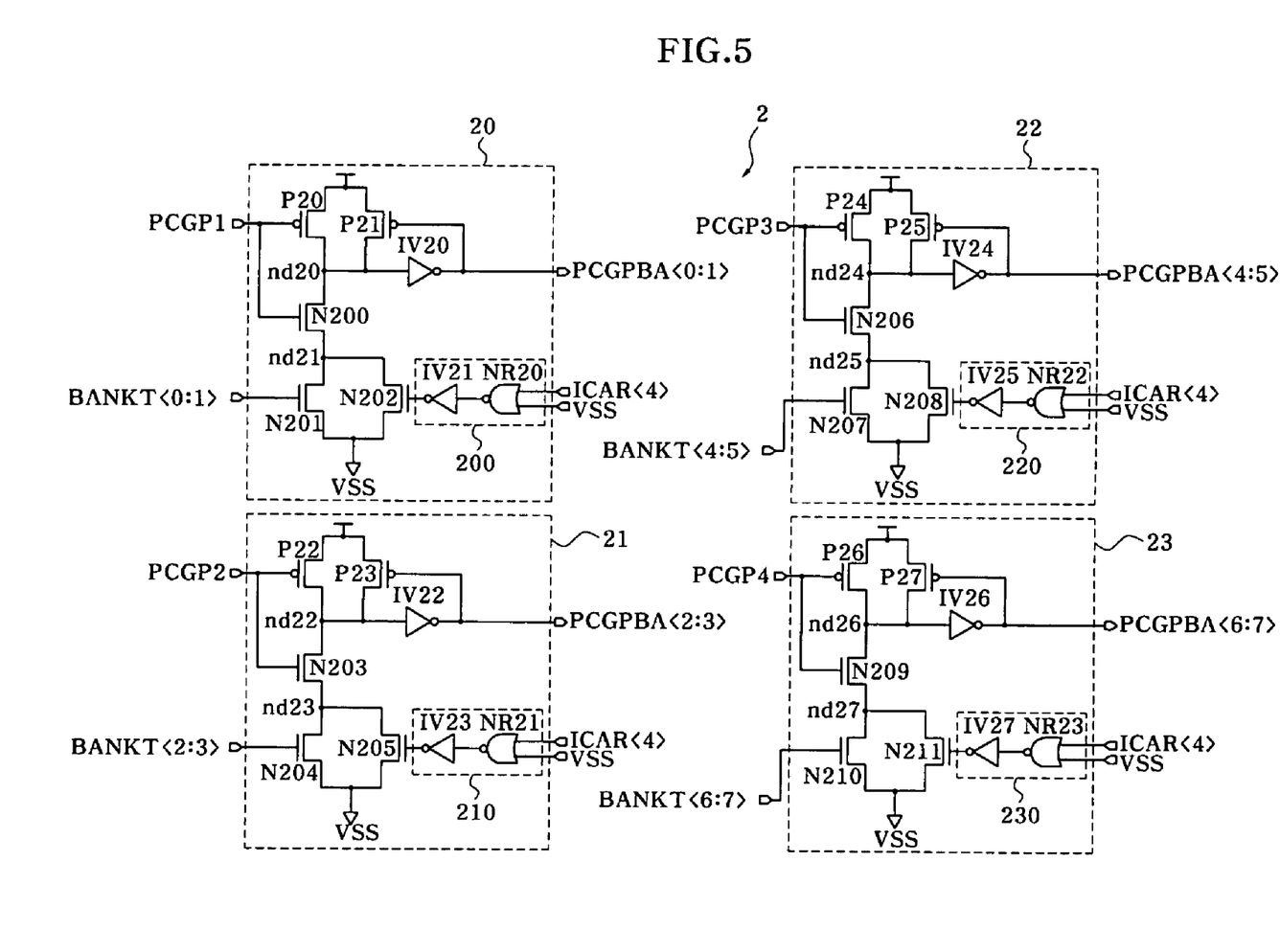
FIG. 5 is a circuit diagram illustrating a bank precharge signal generation unit included in the bank precharge signal generation circuit shown in FIG. 2.

The bank precharge signal generation unit 2 includes, as shown in FIG. 5, first through fourth bank precharge signal generation units 20-23. Here, the first through fourth bank precharge signal generation units 20-23 have the same configuration except for signals input thereto and signals output therefrom, and thus a detailed description of configuration of the first bank precharge signal generation unit 20 only will be provided below.

The first bank precharge signal generation unit 20 includes a PMOS transistor P20 which is connected between a power voltage and a node nd20 and turned on in response to the first precharge signal PCGP1, an NMOS transistor N200 which is connected between the node nd20 and a node nd21 and turned on in response to the first precharge signal PCGP1, an NMOS transistor N201 which is connected between the node nd21 and a ground voltage VSS and turned on in response to a first bank selection signal BANKT<0>, a logic unit 200 which performs a logic operation on the all-bank precharge signal ICAR<4> and the ground voltage VSS inputted thereto, an NMOS transistor N202 which is connected between the node nd21 and the ground voltage VSS and turned on in response to an output signal of the logic unit 200, an inverter IV20 which inverts a signal of the node nd20 to generate first and second bank precharge signal PCGPBA<0:1>, and a PMOS transistor P21 which is turned on in response to the first and second bank precharge signal PCGPBA<0:1>.

The first bank precharge signal generation unit 20 having the aforementioned configuration enables, in a state that a pulse of the first precharge signal PCGP1 is inputted in the single-bank precharge operation, the first bank precharge signal PCGPBA<0> to a high level when the first bank selection signal BANKT<0> is inputted with a high level, and enables the second bank precharge signal PCGPBA<1> to a high level when the second bank selection signal BANKT<1> is inputted with a high level. Here, the first and second bank selection signals BANKT<0:1> are signals for respectively selecting first and second banks, and the first and second bank precharge signals PCGPBA<0:1> are signals for respectively precharging the first and second banks. Meanwhile, the first bank precharge signal generation unit 20 enables both the first and second bank precharge signals PCGPBA<0:1> to a high level to thereby precharge the first and second banks when pulse of the first precharge signal PCGP1 is inputted and the all-bank precharge signal ICAR<4> is at a high level in the all-bank precharge operation.

Since the second through fourth bank precharge signal generation units 21-23 have the same circuit configuration as the first bank precharge signal generation unit 20 as described above, the configurations thereof will not be described and only the operations thereof will be described hereinafter. The second through fourth bank precharge signal generation units 21-23 precharge a bank selected by a signal of the third through eighth bank selection signals BANKT<3:8>, which is inputted with a high level, when a pulse of the second precharge signal PCGP2 in the single-bank precharge operation. Meanwhile, the second through fourth bank precharge signal generation units 21-23 enable both the third and fourth bank precharge signals PCGPBA<2:3> to a high level to precharge third and fourth banks when the pulse of the second precharge signal PCGP2 is inputted and the all-bank precharge signal ICAR<4> is at a high level in the all-bank precharge operation, enables both the fifth and sixth bank precharge signals PCGPBA<4:5> to a high level to precharge fifth and sixth banks when the pulse of the third precharge signal PCGP3 is inputted, and enables both the seventh and eighth bank precharge signals PCGPBA<6:7> to a high level to precharge seventh and eighth banks when the pulse of the fourth precharge signal PCGP4 is inputted.

Hereinafter, operation of the bank precharge signal generation circuit will be described with respect to the single-bank precharge operation and the all-bank precharge operation.

First, the single-bank precharge operation will be described.

The logic unit 100 of the delayed signal generation unit 10 receives the all-bank precharge signal ICAR<4> of a low level and generates the control signal S1 of a high level and the inverted control signal S1B (of a low level) to turn on the transfer gate T10 and turn off the transfer gate T11. Therefore, the delayed signal generation unit 10 generates the first through third delayed precharge signals PCGd1-PCGd3, which are all at a low level in response to the signal of the node nd11 driven at a low level the power up period, and delays the first precharge signal PCGP1 by the delay period of the fourth delay unit 104 to generate PCGd4.

Next, the delayed signal processing unit 12 buffers the fourth delayed precharge signal PCGd4 when the first through third delayed precharge signals PCGd1-PCGd3 are all at a low level in the single-bank precharge operation, to generate the second through fourth precharge signal PCGP2-PCGP4.

Next, the bank precharge signal generation unit 2 enables the bank selection signal for precharging the selected bank when a pulse of the precharge signal is inputted in response to the all-bank precharge signal ICAR<4> of a low level. For example, the bank precharge signal generation unit 2 enables the second bank precharge signal PCGPBA<1> for precharging the second bank to a high level if the second bank selection signal BANKT<1> for selecting the second bank is at a high level when a pulse of the first precharge signal PCGP1 is inputted, and enables the fourth bank precharge signal PCGPBA<3> for precharging the fourth bank to a high level if the fourth bank selection signal BANKT<3> for selecting the fourth bank is at a high level when a pulse of the second precharge signal PCGP2 is inputted.

Second, the all-bank precharge operation will be described.

The logic unit 100 of the delayed signal generation unit 10 receives the all-bank precharge signal ICAR<4> of a high level and the first precharge signal PCGP1 and generates the control signal S1 of a low level and the inverted control signal S1B of a high level to turn on the transfer gate T10 and turn off the control gate T11. Therefore, the delayed signal generation unit 10 generates the fourth delayed precharge signal PCGd4 of a low level, generates the first delayed precharge signal PCGd1 a pulse of which is generated in a period delayed by the delayed period of the first delay unit 101 from a period where the pulse of the first precharge signal PCGP1 is generated, generates the second delayed precharge signal PCGd2 a pulse of which is generated in a period delayed by the delayed period of the second delay unit 102 from a period where the pulse of the first delayed precharge signal PCGd1 is generated, and generates the third delayed precharge signal PCGd3 a pulse of which is generated in a period delayed by the delayed period of the third delay unit 103 from a period where the pulse of the second delayed precharge signal PCGd2 is generated. In other words, in the all-bank precharge operation, the pulses of the first through third delayed precharge signals PCGd1-PCGd3 generated in the delayed signal generation unit 10 are sequentially produced.

Next, The delayed signal processing unit 12 buffers the first delayed precharge signal PCGd1, in response to the fourth delayed precharge signal PCGd4 at a low level in the all-bank precharge operation, to generate the second precharge signal PCGP2, buffers the second delayed precharge signal PCGd2 to generate the third precharge signal PCGP3, and buffers the third delayed precharge signal PCGd3 to generate the fourth precharge signal PCGP4.

Next, the bank precharge signal generation unit 2 receives the all-bank precharge signal ICAR<4> of a high level and the pulse of the first precharge signal PCGP1 and generate the first and second bank precharge signals PCGPBA<0:1> enabled to a high level. Therefore, the first and second banks are precharged at the same time. Also, the bank precharge signal generation unit 2 generates the third and fourth bank precharge signals PCGPBA<2:3> of a high level to precharge the third and fourth banks at the same time when the pulse of the second precharge signal PCGP2 is inputted, generates the fifth and sixth bank precharge signals PCGPBA<4:5> of a high level to precharge the fifth and sixth banks at the same time when the pulse of the third precharge signal PCGP3 is inputted, and generates the seventh and eighth bank precharge signals PCGPBA<6:7> of a high level to precharge the seventh and eighth banks at the same time when the pulse of the fourth precharge signal PCGP4 is inputted.

Figure 6:
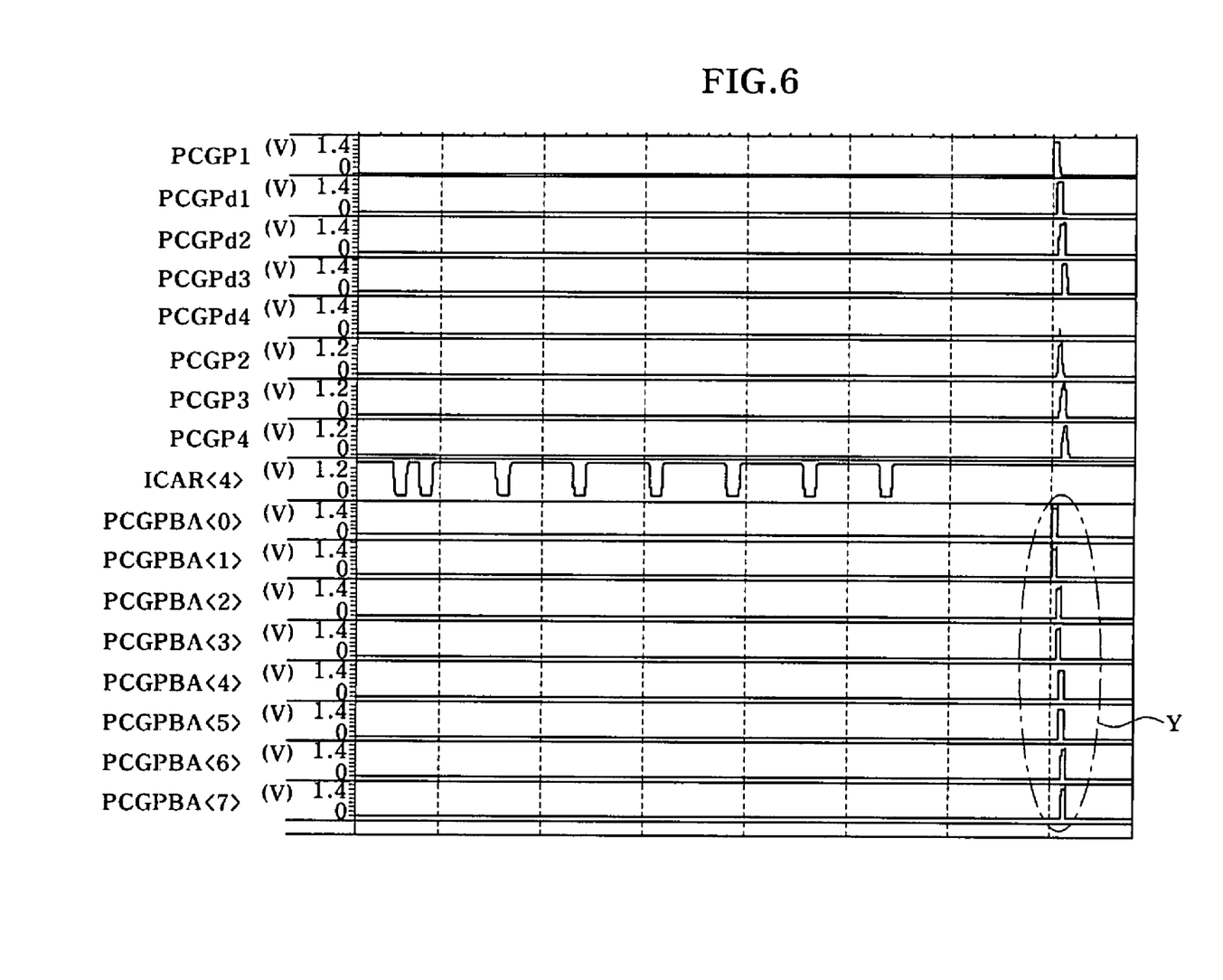
FIG. 6 is a timing diagram illustrating operation of the bank precharge signal generation circuit shown in FIG. 2.

As described above, when performing the all-bank precharge operation by the bank precharge signal generation circuit of the present embodiment, as shown in (Y) of FIG. 6, the first and second bank precharge signals PCGPBA<0:1> for precharging the first and second banks are enabled to a high level, and the third and fourth bank precharge signals PCGPBA<2:3> for precharging the third and fourth banks are then enabled to a high level. Also, after lapse of a predetermined period, the fifth and sixth bank precharge signals PCGPBA<4:5> for precharging the fifth and sixth banks are enabled to a high level, and the seventh and eighth bank precharge signals PCGPBA<6:7> for precharging the seventh and eighth banks are then enabled to a high level.

Figure 7:
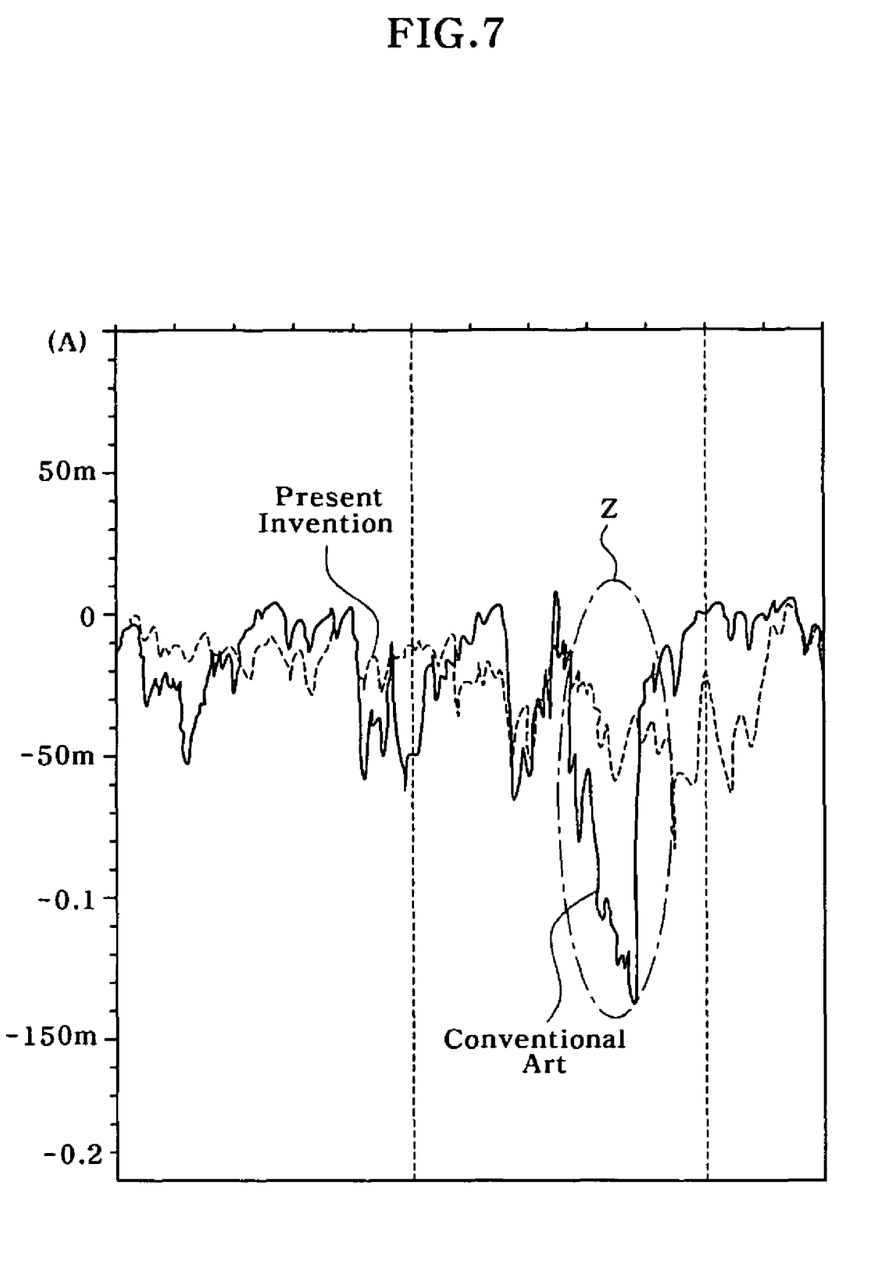
FIG. 7 is a view illustrating an effect of reduction in a peak current using the bank precharge signal generation circuit shown in FIG. 2.

As such, the bank precharge signal generation circuit of the present embodiment, unlike the conventional circuit, does not precharge all of the banks but sequentially precharges two banks at a time in the all-bank precharge operation. Therefore, as shown in (Z) of FIG. 7, in the bank precharge signal generation circuit of the present embodiment, the peak current consumed at a time point where the all-bank precharge operation is initiated is significantly reduced as compared to the conventional circuit.

While the present invention has been described with respect to specific embodiments, it will be apparent to those skilled in the art that various changes and modifications may be made without departing from the spirit and scope of the invention as defined in the following claims.

The present application claims priority to Korean application number 10-2009-0011596, filed on Feb. 12, 2009, which is incorporated by reference in its entirety.

What is claimed is:

1. A bank precharge signal generation circuit, comprising:
    a precharge signal generation unit for generating a second precharge signal including a pulse, which is generated in a period delayed by a predetermined period as compared to a pulse of a first precharge signal, in response to an all-bank precharge signal; and
    a bank precharge signal generation unit for receiving the first and second precharge signals and generate first and second bank precharge signals for precharging first and second banks.

2. The bank precharge signal generation circuit of claim 1, wherein the precharge signal generation unit includes:
    a delayed signal generation unit for generating first and second delayed precharge signals by delaying the first precharge signal by a delay period based on the all-bank precharge signal; and
    a delayed signal processing unit for receiving the first and second delayed precharge signals and generate the second precharge signal.

3. The bank precharge signal generation circuit of claim 2, wherein the delayed signal generation unit delays the first precharge signal by a first delay period and transfers the delayed signal as the first delayed precharge signal when the all-bank precharge signal is enabled in a period where the pulse of the first precharge signal is inputted, and delays the first precharge signal by a second delay period and transfers the delayed signal as the second delayed precharge signal when at least one of the pulse of the first precharge signal is not inputted and the all-bank precharge signal is disabled.

4. The bank precharge signal generation circuit of claim 3, wherein the delayed signal generation unit includes:
    a logic unit for performing a logic operation on the first precharge signal and the all-bank precharge signal inputted thereto;

a first transfer device for transferring the first precharge signal in response to an output signal of the logic unit;

a first delay unit for generating the first delayed precharge signal by delaying an output signal of the first transfer device;

a second delay unit for delaying the first precharge signal; and a second transfer device for transferring an output signal of the second delay unit as the second delayed precharge signal in response to the output signal of the logic unit.

5. The precharge signal generation circuit of claim 4, wherein the delayed signal generation unit further includes: an initialization device for initializing an output node of the first transfer device in response to a power up signal.

6. The bank precharge signal generation circuit of claim 2, wherein the delayed signal processing unit generates the pulse of the second precharge signal when at least one of the pulse of the first delayed precharge signal is inputted and the pulse of the second delayed precharge signal is inputted.

7. The bank precharge signal generation circuit of claim 1, wherein the bank precharge signal generation unit includes:
a first bank precharge signal generation unit for generating the first bank precharge signal enabled when the pulse of the first precharge signal is inputted in a stated that the all-bank precharge signal is enabled; and
a second bank precharge signal generation unit for generating the second bank precharge signal enabled when the pulse of the second precharge signal is inputted in a stated that the all-bank precharge signal is enabled.

8. The bank precharge signal generation circuit of claim 7, wherein the first bank precharge signal generation unit includes:
a first driving device connected between a power voltage and a first node and turned on in response to the first precharge signal;
a second driving device connected between the first node and a second node and turned on in response to the first precharge signal; and
a third driving device connected between the second node and a ground voltage and turned on in response to the all-bank precharge signal.

9. The bank precharge signal generation circuit of claim 8, wherein the first bank precharge signal generation unit further includes: a fourth driving device connected between the second node and a ground voltage and turned on in response to a first bank selection signal for selecting the first bank.

10. The bank precharge signal generation circuit of claim 9, wherein the first driving device is a PMOS transistor and the second through fourth driving device are NMOS transistors.

11. The bank precharge signal generation circuit of claim 7, wherein the second bank precharge signal generation unit includes:
a first driving device connected between a power voltage and a first node and turned on in response to the second precharge signal;
a second driving device connected between the first node and a second node and turned on in response to the second precharge signal; and
a third driving device connected between the second node and a ground voltage and turned on in response to the all-bank precharge signal.

12. The bank precharge signal generation circuit of claim 11, wherein the second bank precharge signal generation unit further includes: a fourth driving device connected between the second node and a ground voltage and turned on in response to a second bank selection signal for selecting the second bank.

13. The bank precharge signal generation circuit of claim 12, wherein the first driving device is a PMOS transistor and the second through fourth driving device are NMOS transistors.

14. A bank precharge signal generation circuit, comprising:
a first bank precharge signal generation unit for generating a first bank precharge signal enabled when a pulse of a first precharge signal is inputted in a state that an all-bank precharge signal is enabled; and
a second bank precharge signal generation unit for generating a second bank precharge signal enabled when a pulse of a second precharge signal is inputted in the state that the all-bank precharge signal is enabled, wherein the inputted pulse of the second precharge signal is delayed by a predetermined period as compared to the pulse of the first precharge signal.

15. The bank precharge signal generation circuit of claim 14, wherein the first bank precharge signal generation unit includes:
a first driving device connected between a power voltage and a first node and turned on in response to the first precharge signal;
a second driving device connected between the first node and a second node and turned on in response to the first precharge signal; and
a third driving device connected between the second node and a ground voltage and turned on in response to the all-bank precharge signal.

16. The bank precharge signal generation circuit of claim 15, wherein the first bank precharge signal generation unit further includes: a fourth driving device connected between the second node and the ground voltage and turned on in response to a first bank selection signal for selecting the first bank.

17. The bank precharge signal generation circuit of claim 16, wherein the first driving device is a PMOS transistor and the second through fourth driving device are NMOS transistors.

18. The bank precharge signal generation circuit of claim 14, wherein the second bank precharge signal generation unit includes:
a first driving device connected between a power voltage and a first node and turned on in response to the second precharge signal;
a second driving device connected between the first node and a second node and turned on in response to the second precharge signal; and
a third driving device connected between the second node and a ground voltage and turned on in response to the all-bank precharge signal.

19. The bank precharge signal generation circuit of claim 18, wherein the second bank precharge signal generation unit further includes: a fourth driving device connected between the second node and the ground voltage and turned on in response to a second bank selection signal for selecting the second bank.

20. The bank precharge signal generation circuit of claim 19, wherein the first driving device is a PMOS transistor and the second through fourth driving device are NMOS transistors.

* * * * *